US012793947B2

(12) United States Patent
Lee et al.

(10) Patent No.: US 12,793,947 B2
(45) Date of Patent: Nov. 10, 2026

(54) APPARATUS FOR TESTING RING ASSEMBLY OF SUBSTRATE PROCESSING APPARATUS

(71) Applicant: SEMES CO., LTD., Cheonan-si (KR)

(72) Inventors: Dong Mok Lee, Chungcheongnam-do (KR); Shant Arakelyan, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 194 days.

(21) Appl. No.: 18/738,535

(22) Filed: Jun. 10, 2024

(65) Prior Publication Data

US 2025/0104983 A1 Mar. 27, 2025

(30) Foreign Application Priority Data

Sep. 21, 2023 (KR) ........................ 10-2023-0126062

(51) Int. Cl.
*H01J 37/32* (2006.01)

(52) U.S. Cl.
CPC .. *H01J 37/32944* (2013.01); *H01J 37/32715* (2013.01); *H01J 37/32816* (2013.01)

(58) Field of Classification Search
None
See application file for complete search history.

(56) References Cited

U.S. PATENT DOCUMENTS 5,665,166 A * 9/1997 Deguchi ........... H01J 37/32174 118/724
6,673,196 B1 * 1/2004 Oyabu .............. H01J 37/32477 156/345.31
2004/0040663 A1 * 3/2004 Udo .................. H01J 37/32706 156/345.51
2009/0000743 A1 * 1/2009 Iizuka ............... H01J 37/32091 156/345.34
2009/0044748 A1 * 2/2009 Pipitone .............. H01J 37/3299 118/697
2018/0100829 A1 * 4/2018 Schönhoff .............. G01N 27/61
2018/0292464 A1 * 10/2018 Shinozaki ............ G01R 31/392
2020/0072907 A1 * 3/2020 Regef .................. G01R 31/392

FOREIGN PATENT DOCUMENTS

KR 19990027883 A 4/1999
KR 101801023 B1 12/2017
KR 20190075152 A 6/2019

* cited by examiner

*Primary Examiner* — Jas A Sanghera
(74) *Attorney, Agent, or Firm* — HARNESS, DICKEY & PIERCE, P.L.C.

(57) ABSTRACT

A ring assembly test apparatus for a substrate processing apparatus of the present invention comprises an electrode body including a bottom electrode disposed below a test object including a ring assembly and a top electrode disposed above the test object, and a power application module for applying power to the electrode body, wherein power is applied to the electrode body to test an occurrence of arcing of the ring assembly outside the substrate processing apparatus that processes a substrate.

20 Claims, 5 Drawing Sheets

200

[FIG. 1]
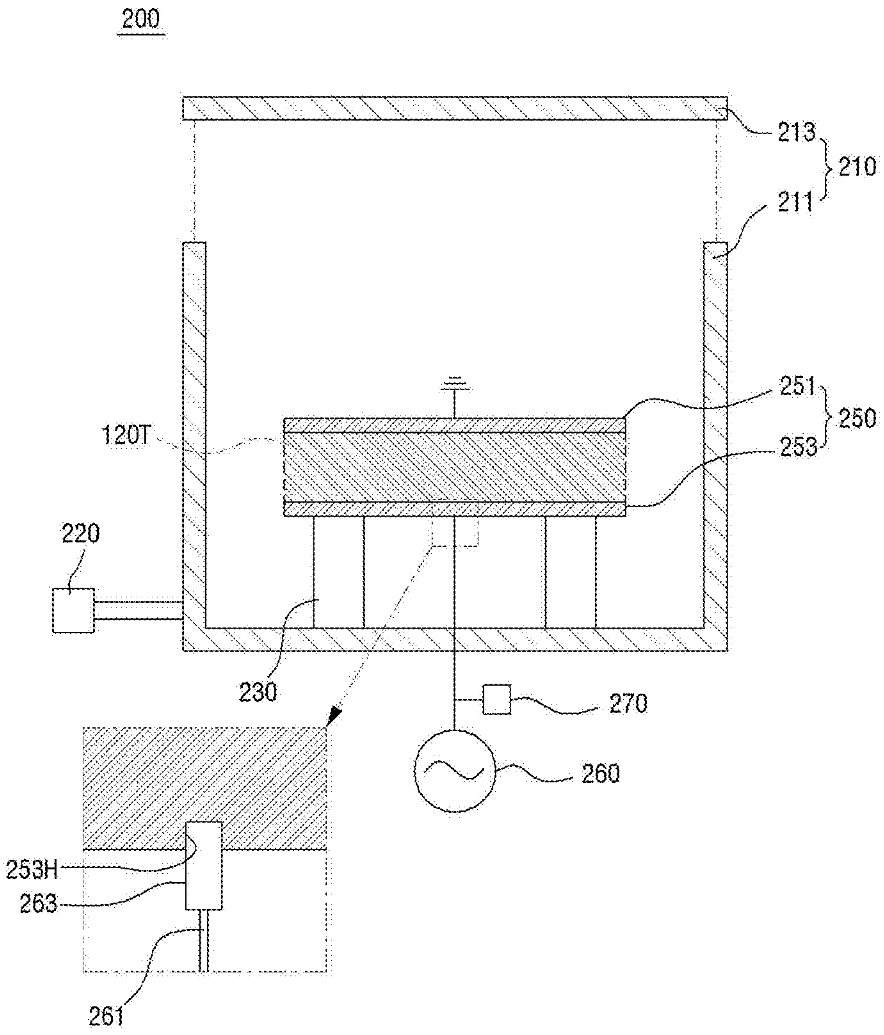

[FIG. 2]
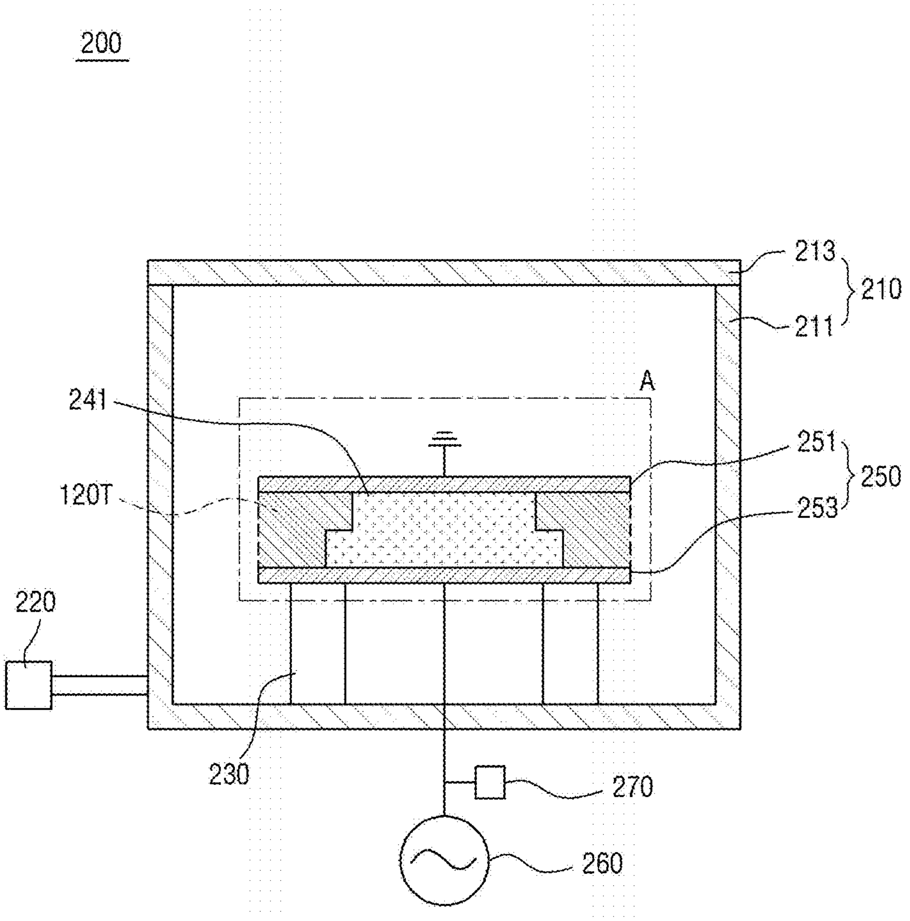

[FIG. 3]
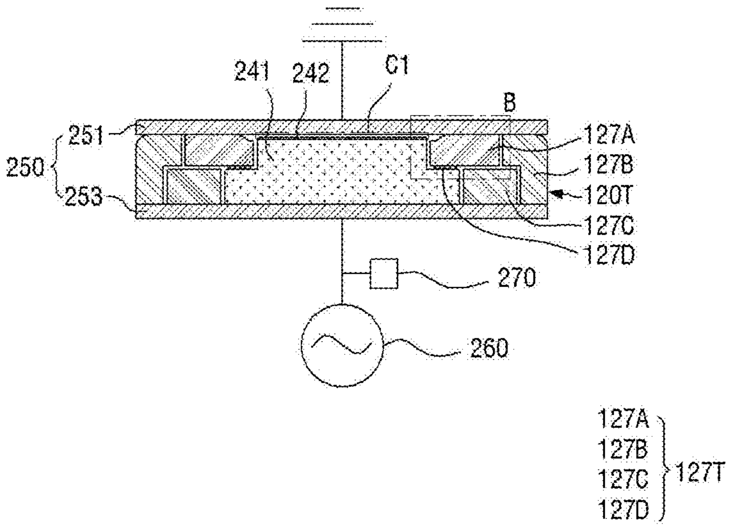
[FIG. 4]
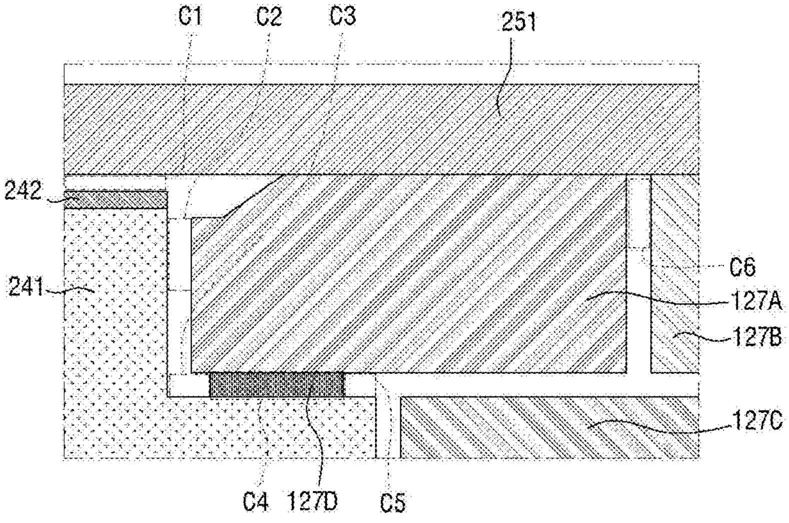

[FIG. 5]
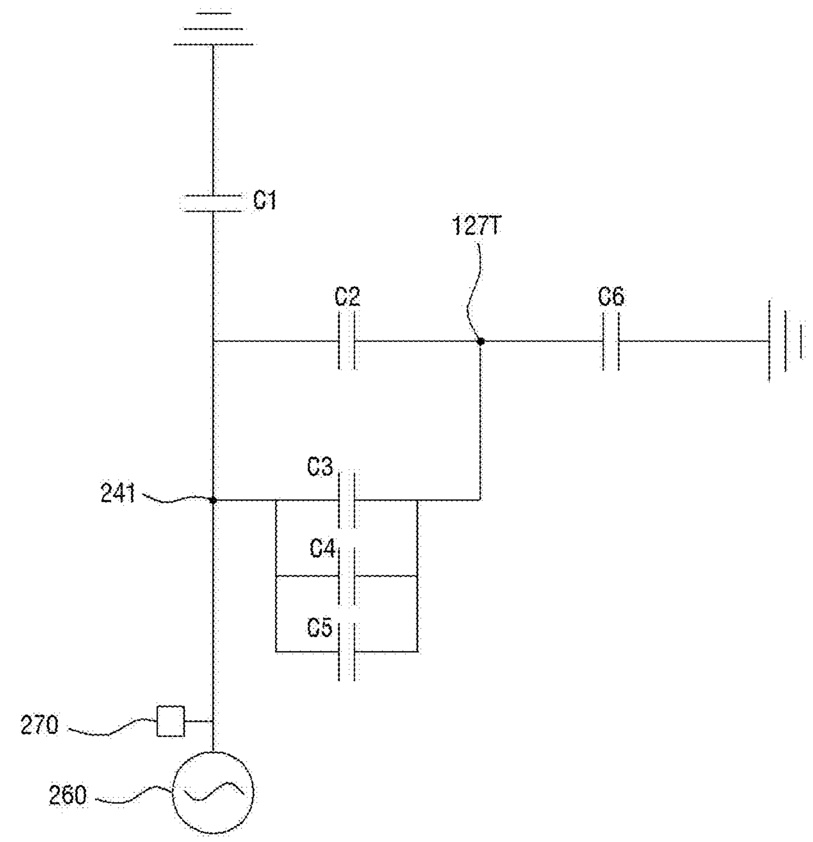
[FIG. 6]
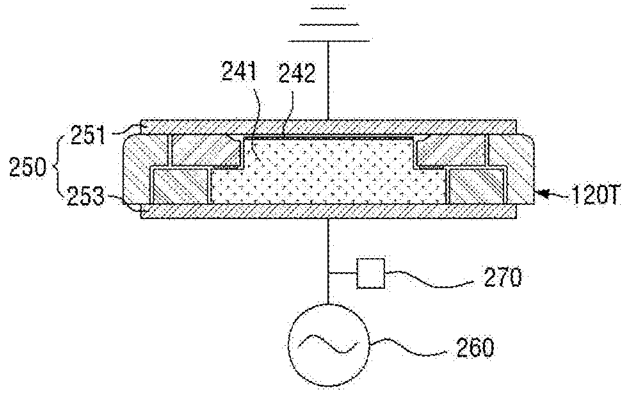

[FIG. 7]
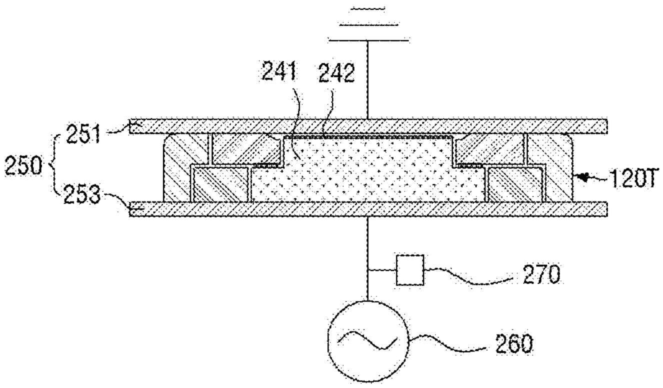

APPARATUS FOR TESTING RING ASSEMBLY OF SUBSTRATE PROCESSING APPARATUS

This application claims the benefit of Korean Patent Application No. 10-2023-0126062, filed on Sep. 21, 2023, in the Korean Intellectual Property Office, the disclosure of which is incorporated herein by reference in its entirety.

BACKGROUND

1. Field

The present invention relates to a ring assembly test apparatus for a substrate processing apparatus.

2. Description of the Related Art

The process of manufacturing a semiconductor comprises a deposition process to form a film on a semiconductor wafer (hereinafter referred to as a substrate), a chemical/mechanical polishing process to flatten the film, a photolithography process to form a photoresist pattern on the film, an etching process to form a film into a pattern with electrical characteristics using a photoresist pattern, an ion implantation process to inject specific ions into a predetermined region of the substrate, a cleaning process to remove impurities on the substrate, and an inspection process to inspect the surface of the substrate on which the film or the pattern is formed.

The etching process is a process for removing exposed regions of the photoresist pattern formed by the photolithography process on the substrate. Types of etching processes can be divided into dry etching and wet etching.

The dry etching process forms an electric field by applying high-frequency power to the upper and lower electrodes installed at a predetermined distance in a sealed internal space where the etching process is performed, and applies an electric field to the reactive gas supplied into the sealed space to activate the reactive gas to create a plasma state. And then, the ions in the plasma etch the substrate located on the lower electrode.

At this time, it is necessary to form plasma uniformly over the entire upper surface of the substrate. A ring assembly is provided to uniformly form plasma over the entire upper surface of the substrate. The ring assembly is installed to surround the edge of the electrostatic chuck.

An electric field is formed on the top of the electrostatic chuck by applying high-frequency power, and the ring assembly greatly expands the area where the electric field is formed compared to the area where the substrate is located. Accordingly, the substrate is located at the center of the area where plasma is formed, and thus the substrate can be uniformly etched.

The ring assembly may be provided by combining a plurality of rings, such as an inner ring and an outer ring. The inner ring and the outer ring are made of different materials, and a gap is formed between the inner ring and the outer ring. The radius and height of the inner ring and outer ring can be changed depending on the design of the substrate processing apparatus. Since arcing is caused by a defective substrate, it is necessary to satisfy the condition that arcing does not occur when designing the ring assembly. For this purpose, the ring assembly needs to be tested to ensure that arcing does not occur or it meets conditions that are minimized.

SUMMARY

The technical problem to be solved by the present invention is to provide a ring assembly test apparatus for a substrate processing apparatus that can test in advance the possibility of arcing occurrence in the ring assembly provided in the substrate processing apparatus.

The objects of the present invention are not limited to the objects mentioned above, and other objects not mentioned will be clearly understood by those skilled in the art from the description below.

One aspect of the ring assembly test apparatus for a substrate processing apparatus of the present invention to achieve the above problem comprises an electrode body including a bottom electrode disposed below a test object including a ring assembly and a top electrode disposed above the test object, and a power application module for applying power to the electrode body, wherein power is applied to the electrode body to test an occurrence of arcing of the ring assembly outside the substrate processing apparatus that processes a substrate Another aspect of a ring assembly test apparatus for a substrate processing device that tests a ring assembly of a substrate processing apparatus, in which a plasma etching process is performed comprises an electrode body including a bottom electrode in contact with a lower surface of the ring assembly, having a radius the same as a radius of the ring assembly, and having a concave fitting groove formed in a lower part, and a top electrode in contact with an upper surface of the ring assembly and having a radius the same as a radius of the ring assembly, a block provided between the bottom electrode and the top electrode, surrounded by the ring assembly, and made of aluminum, a dielectric film provided on an upper surface of the block, a housing including a body having a space for accommodating the electrode body, an opening formed at a top and an inner bottom surface coated with a non-conducting material, and a cover for covering the opening, a support for supporting the electrode body inside the housing and made of a non-conducting material or coated with a non-conducting material, a vacuum pump for creating a vacuum atmosphere inside the housing, a power application module for applying high voltage alternating current having an alternating current power of 0 kW to 30 kW and an alternating current frequency of 50 kHz to 30 mHz to the electrode body, and including a load connected to the fitting groove, and an arc detector provided between the electrode body and the power application module and for detecting an occurrence of arcing, wherein power is applied to the electrode body to test an occurrence of arcing of the ring assembly outside the substrate processing apparatus that processes a substrate.

Specific details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a diagram illustrating a ring assembly test apparatus for a substrate processing apparatus according to a first embodiment of the present invention;

FIG. 2 is a diagram showing a ring assembly test apparatus for a substrate processing apparatus according to a second embodiment of the present invention;

FIG. 3 is a diagram illustrating region A of FIG. 2;

FIG. 4 is a diagram illustrating region B of FIG. 3;

FIG. 5 is a diagram illustrating an equivalent circuit of a ring assembly test apparatus for a substrate processing apparatus according to some embodiments of the present invention;

FIG. 6 is a diagram illustrating a portion of a ring assembly test apparatus for a substrate processing apparatus according to a third embodiment of the present invention; and FIG. 7 is a diagram illustrating a portion of a ring assembly test apparatus for a substrate processing apparatus according to a fourth embodiment of the present invention.

DETAILED DESCRIPTION

Hereinafter, preferred embodiments of the present invention will be described in detail with reference to the attached drawings. The advantages and features of the present invention and methods for achieving them will become clear by referring to the embodiments described in detail below along with the accompanying drawings. However, the present invention is not limited to the embodiments disclosed below and may be implemented in various different forms. The present embodiments are merely intended to ensure that the disclosure of the present invention is complete, and provided to fully inform those skilled in the art on the scope of the invention, and the present invention is only defined by the scope of the claims. Like reference numerals refer to like elements throughout the specification.

The terminology used herein is for describing embodiments and is not intended to limit the invention. As used herein, singular forms also include plural forms, unless specifically stated otherwise in the context. As used herein, "comprises" and/or "comprising" does not rule out the addition or the presence of one or more other components, steps, operations and/or elements.

FIG. 1 is a diagram illustrating a ring assembly test apparatus for a substrate processing apparatus according to a first embodiment of the present invention.

Referring to FIG. 1, the ring assembly test apparatus 200 for a substrate processing apparatus according to an embodiment of the present invention comprises a housing 210, a support 230, an electrode body 250, a power application module 260 and an arc detector 270, and can test the test object 120T. For example, the test object 120T may include a ring assembly 127T (see FIG. 3), and according to a modified example of the embodiment, may include a chuck for supporting the substrate. And the test may be an arcing occurrence test.

The ring assembly test apparatus 200 for a substrate processing apparatus can test the occurrence of arcing in the ring assembly 127T outside of a substrate processing apparatus (not shown) that processes a substrate (not shown). That is, when designing a substrate processing apparatus, an arcing occurring environment can be provided so that the ring assembly 127T can be tested to see if it satisfies the condition that arcing does not occur, such as the radius and/or height of the ring assembly 127T, the spacing between a plurality of rings (e.g., the first ring 127A, the second ring 127B, and the third ring 127C), etc.

Here, the substrate processing apparatus may perform an etching process using plasma, and the ring assembly 127T may be provided, but the present invention is not limited thereto.

For example, the ring assembly test apparatus 200 for a substrate processing apparatus of this embodiment can provide an environment in which current flows to the test object 120T and test whether arcing occurs due to current flow.

If arcing does not occur in the test object 120T while the current flows, it can be assumed that the test object 120T satisfies the design conditions. In contrast, if arcing occurs in the test object 120T due to the flow of current, it is assumed that the manufacturing conditions of the substrate processing apparatus are not satisfied, and after changing the design value (e.g., radius, thickness, etc.) of any one of a plurality of rings of the ring assembly 127T (e.g., the first ring 127A, the second ring 127B and/or the third ring 127C), the changed ring assembly 127T may be tested again.

The housing 210 is a space for accommodating the electrode body 250 and may provide a space for testing the arcing occurrence of the ring assembly 127T. The housing 210 may be provided in a sealed structure so that a vacuum atmosphere is formed. The housing 210 may have a hollow cube, a hollow cylinder, or other shapes. By way of example, the housing 210 may include a body 211 and a cover 213.

A space with an open top may be formed in the body 211. The body 211 is a material with rigidity so that shape deformation does not occur when a vacuum atmosphere is formed. For example, it may be made of metal, and the bottom or inner surface may be coated with a non-conducting material, but this is only an example, and various modifications are possible.

The cover 213 is provided at the top of the test space and covers the open upper surface of the body 211, thereby sealing the space of the body 211. The cover 213 is made of a material with the same rigidity as the body 211, and may be made of metal, for example.

The cover 213 may have various structures for opening and closing, such as having a structure that is completely separate from the body 211, being provided on the body 211 to be able to slide in the horizontal direction, or being rotatable in the vertical direction.

In addition, a handle (not shown) may be provided to facilitate the operator opening and closing the open upper surface of the body 211, or an open module (not shown) may be provided for an automatic opening structure. The open module may be provided as a combination of an actuator, a motor, and/or a gear unit that pushes, pulls, or rotates the cover 213, but is not limited to this.

A vacuum pump 220 may be connected to the body 211 of the housing 210. The vacuum pump 220 may create a vacuum atmosphere inside the housing 210 and provide an environment that is the same as or similar to that of the substrate processing apparatus.

The electrode body 250 may include a top electrode 251 and a bottom electrode 253.

The top electrode 251 may be disposed above the test object 120T. As an example, the top electrode 251 may be provided in contact with the upper surface of the test object 120T. And the bottom electrode 253 may be disposed below the test object 120T. As an example, the bottom electrode 253 may be disposed in contact with the lower surface of the test object 120T.

The radius of each of the top electrode 251 and the bottom electrode 253 may be the same as the radius of the test object 120T. That is, the radius of each of the bottom electrode 253 and the top electrode 251 may be the same as the radius of the ring assembly 127T. However, this is only an example, and other examples are possible.

And the bottom electrode 253 may be formed with a fitting groove 253H in order to be electrically connected to the power application module 260. The fitting groove 253H may have a concave groove structure, and the rod 263 of the power application module 260 may be inserted and connected to the fitting groove 253H. In addition, although not shown in the drawings, various modifications are possible, such as a structure in which a fitting groove is formed in the top electrode 251 and a rod for connecting an electric wire is fastened.

The power application module 260 is configured to provide an arcing occurrence environment to the test object 120T. To this end, the power application module 260 may apply power to the electrode body 250.

The power application module 260 may apply power in the same manner as the method of applying power in the substrate processing apparatus, so as to provide the same or similar environment as that of the substrate processing apparatus. The power application module 260 may apply high voltage alternating current. For example, the alternating current power may be 0 kW to 30 kW, and the alternating current frequency may be 50 kHz to 30 mHz.

The power application module 260 may include a wire 261 and a load 263. The rod 263 may be connected by fitting to the fitting groove 253H of the bottom electrode 253 and electrically connected to the bottom electrode 253.

The arc detector 270 is a component that detects the occurrence of arcing and may be provided between the electrode body 250 and the power application module 260. The arc detector 270 is provided with a port (not shown) and can be connected to the wire 261 provided in the power application module 260.

As an example, the arc detector 270 may detect a current (current signal) applied by the power application module 260. If the current signal detected by the arc detector 270 suddenly becomes a high current signal, such as 20% or more compared to the average current signal applied by the power application module 260, it can be assumed that an event has occurred.

That is, the arc detector 270 detects current and current changes, and when an arc occurs in the test object 120T and the current suddenly increases, this can be assumed to be an arc occurrence event.

For example, the arc detector 270 may calculates at least one of the signal average, signal standard deviation, difference between the maximum and minimum current values (pole difference), and signal average power for the current signal, and may calculate frequency component change characteristics for the signal to detect an arc occurrence, but is not limited to this.

The arc detector 270 can simplify inspection work by allowing an operator to determine whether arcing has occurred without visually inspecting arcing.

And, when the arc detector 270 detects the occurrence of arcing, the next step is to closely inspect which area of the ring assembly 127T the arcing occurred, and this uses image data like a vision camera to detect the arcing occurrence area. Alternatively, the arcing occurrence area may be inspected through various modified ways, such as visual inspection.

The support 230 may support the electrode body 250 inside the housing 210. The support 230 may be made of a non-conducting material or coated with a non-conducting material so that current is not transmitted from the electrode body 250 to the housing 210 even when high voltage alternating current is applied.

The support 230 may have various shapes capable of supporting the electrode body 250. For example, the support 230 may have a table shape or a bar shape, but is not limited thereto. In addition, the support 230 may be provided to prevent current from being transmitted from the electrode body 250 if the housing 210 is made of a rigid material, for example, a metal material. Several modifications are possible, such as the support may be omitted when the housing 210 is made of a non-conducting material or coated with a non-conducting material.

In the ring assembly test apparatus 200 for a substrate processing apparatus according to this embodiment, an arcing test may be performed on the test object 120T.

The test object 120T may include, in addition to the ring assembly 127T, a chuck (not shown) surrounded by the ring assembly 127T. However, according to a modified example of the embodiment, a chuck (not shown) can be omitted in the test object 120T. In addition, the ring assembly test apparatus 200 for a substrate processing apparatus may further be provided with a block 241 according to a modified example of the embodiment.

Hereinafter, a modified example of this embodiment will be described with reference to FIGS. 2 to 7, and overlapping descriptions of the same configuration performing the same function will be omitted.

FIG. 2 is a view showing a ring assembly test apparatus for a substrate processing apparatus according to a second embodiment of the present invention, FIG. 3 is a view showing region A of FIG. 2, FIG. 4 is a view showing region B of FIG. 3, and FIG. 5 is a diagram illustrating an equivalent circuit of a ring assembly test apparatus for a substrate processing apparatus according to some embodiments of the present invention.

With reference to FIGS. 2 to 5, differences from those described using FIG. 1 will be mainly explained.

Referring to FIGS. 2 to 5, the ring assembly test apparatus 200 for a substrate processing apparatus of the second embodiment is the same as or similar to the first embodiment, and includes a housing 210, an electrode body 250, a power application module 260 and an arc detector 270, and may test the test object 120T.

Meanwhile, the ring assembly test apparatus 200 for a substrate processing apparatus of the second embodiment may further include a block 241 and a dielectric film 242, the test object 120T is provided to a ring assembly 127T, and the chuck of the substrate processing apparatus may be omitted.

In order to test the conditions for preventing arcing occurrence of the ring assembly 127T, which is the test object 120T, the ring assembly test apparatus 200 for a substrate processing apparatus provides an environment, in which an impedance of the same or similar conditions as that of the substrate processing apparatus is formed.

In other words, the ring assembly test apparatus 200 for a substrate processing apparatus provides the same or similar environment as the ring assembly 127T installed in the chuck of the substrate processing apparatus in order to test whether arcing occurs in the ring assembly 127T. Accordingly, a block 241 and a dielectric film 242 may be provided.

The block 241 may correspond to a chuck of a substrate processing apparatus. That is, the block 241 may be provided in the same material and shape as the chuck. For example, the block 241 may be provided in the shape of a disk made of aluminum, and a step may be formed at the edge.

The dielectric film 242 may be provided on the upper surface of the block 241 and may be made of a dielectric material, and may allow current to flow when high voltage alternating current is applied. The dielectric film 242 may have a thickness of 1 cm or less, for example, 0.1 mm to 5 mm.

The block 241 and the dielectric film 242 may be provided between the bottom electrode 253 and the top electrode 251, and a ring assembly 127T may be disposed at the edge of the block 241. Here, the block 241 may be surrounded by the ring assembly 127T.

As such, the ring assembly test apparatus 200 for a substrate processing apparatus including the block 241 and the dielectric film 242 provides an environment the same as or similar to the environment in which the ring assembly 127T is installed. Therefore, there is no need to repeatedly install the chuck to provide an environment similar to that of a substrate processing apparatus each time an arcing test is performed, and if the test object 120T is provided to the ring assembly 127T, test can be done by replacing only the ring assembly 127T, and thus replacement work for test can be simplified and work loss can be reduced.

That is, when performing an arcing test, only the ring assembly 127T is replaced, and the block 241 and the dielectric film 242 can be continuously installed inside the housing 210.

Referring to FIG. 3, the top electrode 251 may have a radius that contacts each of the first ring 127A and the second ring 127B, and the bottom electrode 253 may have a radius that contacts each of the second ring 127B and the third ring 127C. That is, as in the first embodiment, each of the top electrode 251 and the bottom electrode 253 may be equal to the radius of the ring assembly 127T.

However, it is not limited to this, and as in the third and fourth embodiments, several modified examples are possible, such as the radii of the top electrode 251 and the bottom electrode 253 may have a different radius from the radius of the ring assembly 127T.

Referring to FIGS. 3 and 4, around the block 241 and the ring assembly 127T, there is an area (hereinafter referred to as an 'arcing area') where a potential difference occurs, such as a gap, a dielectric film 242, and a thermal pad 127D, and there is a possibility of arcing occurring in these arcing areas.

The arcing areas can be divided into the first arcing area C1, the second arcing area C2, the third arcing area C3, the fourth arcing area C4, the fifth arcing area C5 and the sixth arcing area C6.

The first arcing area C1 may be an area containing the dielectric film 242 and the space between the dielectric film 242 and the top electrode 251. The second arcing area C2 may be an area consisting of a gap between the block 241 and the first ring 127A. The third arcing area C3 may be an area consisting of a gap between the block 241 and the thermal pad 127D.

The fourth arcing area C4 may be an area containing the thermal pad 127D. The fifth arcing area C5 may be an outer area of the thermal pad 127D. The sixth arcing area C6 may be an area consisting of a gap between the first ring 127A and the second ring 127B.

Referring to FIG. 5, which shows an equivalent circuit related to this arcing area (the ring assembly 127T in FIG. 7 may refer to the first ring 127A), if a current change occurs in the process of flowing current along the first arcing area C1, the second arcing area C2, the third arcing area C3, the fourth arcing area C4, the fifth arcing area C5, and the sixth arcing area C6, the arc detector 270 can detect this and determine whether arcing has occurred.

Here, the third arcing area C3, the fourth arcing area C4, and the fifth arcing area C5 have a current flow from the block 241 toward the thermal pad 127D, and this is the current related to around the thermal pad 127D and can be assumed to be connected in parallel.

In addition, the second arcing area C2 allows current to flow outward from the block 241 at the same time as the previously mentioned third arcing area C3, fourth arcing area C4, and fifth arcing area C5, and can be assumed to be connected in parallel.

And the first arcing area C1 has a current flow from the block 241 toward the dielectric film 242, and the sixth arcing area C6 has a current flow from the first ring 127A of the ring assembly 127T along the second ring 127B, and can be assumed to be connected in series with the second arcing area C2.

When high voltage alternating current is applied to the electrode body 250, whether or not arcing occurs can be determined by the size of the gap formed between the plurality of rings (the first ring 127A, the second ring 127B, and the third ring 127C) of the ring assembly 120T and the shape of the ring assembly 120T, etc., and by testing using the ring assembly test apparatus 200 for a substrate processing apparatus of this embodiment, before designing the substrate processing apparatus, a ring assembly 120T that satisfies the condition for non-occurrence of arcing can be designed.

The ring assembly 127T not explained is as follows.

Referring to FIG. 3, for example, a test object 120T is provided to a ring assembly 127T, and the ring assembly 127T may include a first ring 127A, a second ring 127B, a third ring 127C, and a thermal pad 127D.

The first ring 127A is an inner ring and may surround the block 241. The second ring 127B is an outer ring and may surround the first ring 127A. The third ring 127C may be provided below the first ring 127A and may be surrounded by the second ring 127B. The thermal pad 127D may dissipate heat generated in the ring assembly 127T. However, this is only an example and is not limited thereto.

FIG. 6 is a diagram showing a portion of a ring assembly test apparatus for a substrate processing apparatus according to a third embodiment of the present invention, and FIG. 7 is a diagram showing a portion of a ring assembly test apparatus for a substrate processing apparatus according to a fourth embodiment of the present invention.

Referring to FIG. 6, the electrode body 250 of the ring assembly test apparatus 200 for a substrate processing apparatus of the third embodiment may be formed to be smaller than the radius of the ring assembly 127T.

For example, the top electrode 251 may have a radius that is larger than the outer diameter of the first ring 127A and smaller than the outer diameter of the second ring 127B so as to contact each of the first ring 127A and the second ring 127B. The bottom electrode 253 may have a radius that is larger than the outer diameter of the third ring 127C and smaller than the outer diameter of the second ring 127B so as to contact each of the second ring 127B and the third ring 127C.

Referring to FIG. 7, the electrode body 250 of the ring assembly test apparatus 200 for a substrate processing apparatus of the fourth embodiment may be formed to be larger than the radius of the ring assembly 127T.

For example, the electrode body 250 may form 100% to 150% of the radius of the ring assembly 127T. That is, each of the top electrode 251 and the bottom electrode 253 may be formed to be larger than the outer diameter of the second ring 127B.

In addition, another embodiment is possible by combining any one or more of the first to fourth embodiments, and the ring assembly test apparatus 200 of the present embodiments may be supplied with a process gas to provide an environment in which plasma is formed in the same or similar manner as the substrate processing apparatus.

Although the embodiments of the present invention have been described with reference to the above and accompanying drawings, those skilled in the art to which the present invention pertains can understand that the present invention can be practiced in other specific forms without changing the technical spirit or essential features. Therefore, the embodiments described above should be understood as illustrative in all respects and not limiting.

| [Reference Numeral] | |
|---|---|
| 200: ring assembly test apparatus | 210: housing |
| 230: support | 250: electrode body |
| 260: power application module | 270 arc detector |

What is claimed is:

1. A ring assembly test apparatus for a substrate processing apparatus comprising:
   an electrode body including a bottom electrode configured to be below a test object, which includes a ring assembly, the electrode body including a top electrode configured to be above the test object; and
   a power application module configured to apply power to the electrode body,
   wherein the electrode body is configured to have power applied to test an occurrence of arcing of the ring assembly, the testing being done in an environment that is outside the substrate processing apparatus that processes a substrate.

2. The ring assembly test apparatus of claim 1, wherein the power application module is configured to apply high voltage alternating current to the bottom electrode and to ground the top electrode.

3. The ring assembly test apparatus of claim 2, wherein the high voltage alternating current has an alternating current power of 0 kW to 30 kW and an alternating current frequency of 50 kHz to 30 MHz.

4. The ring assembly test apparatus of claim 1, further comprising;
   an arc detector between the electrode body and the power application module and configured to detect an occurrence of arcing.

5. The ring assembly test apparatus of claim 1, further comprising:
   a housing having a space for accommodating the electrode body.

6. The ring assembly test apparatus of claim 5, wherein the housing comprises,
   a body, in which the space is formed and an opening is formed; and
   a cover for covering the opening.

7. The ring assembly test apparatus of claim 5 further comprises,
   a vacuum pump configured to create a vacuum atmosphere inside the housing.

8. The ring assembly test apparatus of claim 7, wherein the housing is made of a metal material.

9. The ring assembly test apparatus of claim 8, wherein an inner bottom surface of the housing is coated with a non-conducting material.

10. The ring assembly test apparatus of claim 8 further comprises,
    a support configured to support the electrode body inside the housing and made of a non-conducting material or coated with a non-conducting material.

11. The ring assembly test apparatus of claim 1, further comprising:
    a block between the bottom electrode and the top electrode, and surrounded by the ring assembly.

12. The ring assembly test apparatus of claim 11, wherein the block is made of aluminum.

13. The ring assembly test apparatus of claim 12 further comprising:
    a dielectric film provided on an upper surface of the block.

14. The ring assembly test apparatus of claim 1, wherein a radius of each of the bottom electrode and the top electrode is 100% to 150% of a radius of the test object.

15. The ring assembly test apparatus of claim 1, wherein the bottom electrode is in contact with a lower surface of the test object, and
    the top electrode is disposed in contact with an upper surface of the test object.

16. The ring assembly test apparatus of claim 1, wherein the bottom electrode is formed with a concave fitting groove, and
    the power application module includes a rod connected to the concave fitting groove so as to be electrically connected to the bottom electrode.

17. The ring assembly test apparatus of claim 1, wherein the top electrode is configured to be in direct contact with the test object.

18. A ring assembly test apparatus for a substrate processing apparatus comprising:
    an electrode body including a bottom electrode configured to be below a test object, the test object including a ring assembly, the electrode body including a top electrode configured to be above the test object; and
    a power application module configured to apply power to the electrode body,
    wherein the electrode body is configured to have power applied to test an occurrence of arcing of the ring assembly outside the substrate processing apparatus that processes a substrate,
    wherein the ring assembly test apparatus further comprises:
    a block between the bottom electrode and the top electrode, and surrounded by the ring assembly, wherein the ring assembly includes a first ring surrounding the block and a second ring surrounding the first ring,
    wherein the top electrode is in contact with each of the first ring and the second ring, and has a radius that is larger than an outer diameter of the first ring and smaller than an outer diameter of the second ring.

19. The ring assembly test apparatus of claim 18, wherein the ring assembly further includes a third ring surrounding the block, provided below the first ring, and surrounded by the second ring,
    wherein the bottom electrode is in contact with each of the second ring and the third ring, and has a radius that is larger than an outer diameter of the third ring and smaller than an outer diameter of the second ring.

20. A ring assembly test apparatus for a substrate processing device that IS configured to test a ring assembly of a substrate processing apparatus, in which a plasma etching process is configured to be performed, the ring assembly test apparatus comprising:
    an electrode body including a bottom electrode in contact with a lower surface of the ring assembly, having a radius the same as a radius of the ring assembly, and having a concave fitting groove formed in a lower part, and a top electrode in contact with an upper surface of the ring assembly and having a radius the same as a radius of the ring assembly;

a block provided between the bottom electrode and the top electrode, surrounded by the ring assembly, and made of aluminum;

a dielectric film provided on an upper surface of the block;

a housing including a body having a space for accommodating the electrode body, an opening formed at a top and an inner bottom surface coated with a non-conducting material, and a cover for covering the opening;

a support configured to support the electrode body inside the housing and made of a non-conducting material or coated with a non-conducting material;

a vacuum pump configured to create a vacuum atmosphere inside the housing;

a power application module configured to apply high voltage alternating current having an alternating current power of 0 kW to 30 kW and an alternating current frequency of 50 kHz to 30 MHz to the electrode body, and including a load connected to the concave fitting groove; and an arc detector between the electrode body and the power application module and configured to detect an occurrence of arcing, wherein the electrode body is configured to have power applied to test an occurrence of arcing of the ring assembly in an environment that is outside the substrate processing apparatus.

* * * * *